United States Patent
Fukazawa

(10) Patent No.: US 10,186,420 B2
(45) Date of Patent: *Jan. 22, 2019

(54) FORMATION OF SILICON-CONTAINING THIN FILMS

(71) Applicant: ASM IP Holding B.V., Almere (NL)

(72) Inventor: Atsuki Fukazawa, Tama (JP)

(73) Assignee: ASM IP HOLDING B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 15/787,342

(22) Filed: Oct. 18, 2017

(65) Prior Publication Data

US 2018/0151355 A1 May 31, 2018

Related U.S. Application Data

(60) Provisional application No. 62/427,670, filed on Nov. 29, 2016.

(51) Int. Cl.
*H01L 21/02* (2006.01)

(52) U.S. Cl.
CPC .... *H01L 21/02252* (2013.01); *H01L 21/0228* (2013.01); *H01L 21/02118* (2013.01); *H01L 21/02123* (2013.01); *H01L 21/02208* (2013.01)

(58) Field of Classification Search
CPC ................................................ H01L 21/02252
See application file for complete search history.

(56) References Cited

U.S. PATENT DOCUMENTS

| | | |
|---|---|---|
| 3,708,728 A | 1/1973 | Sterling et al. |
| 3,925,337 A | 12/1975 | Heiberger |
| 4,058,430 A | 11/1977 | Suntola et al. |
| 4,282,267 A | 8/1981 | Küyel |
| 4,389,973 A | 6/1983 | Suntola et al. |
| 4,565,747 A | 1/1986 | Nakae et al. |
| 4,747,367 A | 5/1988 | Posa |
| 4,761,269 A | 8/1988 | Conger et al. |
| 4,767,494 A | 8/1988 | Kobayashi |

(Continued)

FOREIGN PATENT DOCUMENTS

| | | |
|---|---|---|
| EP | 0387403 | 9/1990 |
| EP | 0899779 | 3/1999 |

(Continued)

OTHER PUBLICATIONS

U.S. Appl. No. 15/342,943, filed Nov. 3, 2016 including prosecution history, including but not limited to Notice of Allowance dated Jun. 13, 2017.

(Continued)

*Primary Examiner* — William Coleman
(74) *Attorney, Agent, or Firm* — Knobbe, Martens, Olson & Bear LLP

(57) ABSTRACT

Methods for depositing silicon-containing thin films on a substrate in a reaction space are provided. The methods can include at least one plasma enhanced atomic layer deposition (PEALD) cycle including one or more deposition cycles including contacting the substrate with a silicon precursor and a second reactant that does not include oxygen. In some embodiments the methods a deposition cycle can also including contacting the substrate with a carbon precursor.

21 Claims, 3 Drawing Sheets

(56) References Cited

U.S. PATENT DOCUMENTS

| | | |
|---|---|---|
| 4,851,095 A | 7/1989 | Scobey et al. |
| 4,935,661 A | 6/1990 | Heinecke et al. |
| 5,071,670 A | 12/1991 | Kelly |
| 5,166,092 A | 11/1992 | Mochizuki et al. |
| 5,221,556 A | 6/1993 | Hawkins et al. |
| 5,270,247 A | 12/1993 | Sakuma et al. |
| 5,281,274 A | 1/1994 | Yoder |
| 5,306,666 A | 4/1994 | Izumi |
| 5,316,793 A | 5/1994 | Wallace et al. |
| 5,342,652 A | 8/1994 | Foster et al. |
| 5,482,262 A | 1/1996 | Hayakawa et al. |
| 5,595,784 A | 1/1997 | Kaim et al. |
| 5,603,771 A | 2/1997 | Seiberras et al. |
| 5,618,395 A | 4/1997 | Gartner |
| 5,691,235 A | 11/1997 | Meikle et al. |
| 5,693,139 A | 12/1997 | Nishizawa et al. |
| 5,711,811 A | 1/1998 | Suntola et al. |
| 5,723,384 A | 3/1998 | Park et al. |
| 5,744,254 A | 4/1998 | Kampe et al. |
| 5,769,950 A | 6/1998 | Takasu et al. |
| 5,789,024 A | 8/1998 | Levy et al. |
| 5,855,680 A | 1/1999 | Soininen |
| 5,916,365 A | 6/1999 | Sherman |
| 5,946,598 A | 8/1999 | Yeh |
| 5,947,710 A | 9/1999 | Cooper et al. |
| 5,964,943 A | 10/1999 | Stein et al. |
| 5,965,004 A | 10/1999 | Cowley et al. |
| 5,972,430 A | 10/1999 | DiMeo et al. |
| 5,973,400 A | 10/1999 | Murakami et al. |
| 6,006,763 A | 12/1999 | Mori et al. |
| 6,015,590 A | 1/2000 | Suntola et al. |
| 6,087,257 A | 7/2000 | Park et al. |
| 6,099,904 A | 8/2000 | Mak et al. |
| 6,104,074 A | 8/2000 | Chen |
| 6,113,977 A | 9/2000 | Soininen et al. |
| 6,124,158 A | 9/2000 | Dautartas et al. |
| 6,139,624 A | 10/2000 | Rupp |
| 6,139,700 A | 10/2000 | Kang et al. |
| 6,144,060 A | 11/2000 | Park et al. |
| 6,156,382 A | 12/2000 | Rajagopalan et al. |
| 6,162,501 A | 12/2000 | Kim |
| 6,174,809 B1 | 1/2001 | Kang et al. |
| 6,188,134 B1 | 2/2001 | Stumborg et al. |
| 6,194,310 B1 | 2/2001 | Hsu et al. |
| 6,200,389 B1 | 3/2001 | Miller et al. |
| 6,203,613 B1 | 3/2001 | Gates et al. |
| 6,206,967 B1 | 3/2001 | Mak et al. |
| 6,234,646 B1 | 5/2001 | Ito |
| 6,270,572 B1 | 8/2001 | Kim et al. |
| 6,284,646 B1 | 9/2001 | Leem |
| 6,287,965 B1 | 9/2001 | Kang et al. |
| 6,342,277 B1 | 1/2002 | Sherman |
| 6,355,561 B1 | 3/2002 | Sandhu et al. |
| 6,380,627 B1 | 4/2002 | Weihs et al. |
| 6,391,785 B1 | 5/2002 | Satta et al. |
| 6,416,577 B1 | 7/2002 | Suntola et al. |
| 6,464,779 B1 | 10/2002 | Powell et al. |
| 6,475,276 B1 | 11/2002 | Elers et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,511,539 B1 | 1/2003 | Raaijmakers |
| 6,534,395 B2 | 3/2003 | Werkhoven et al. |
| 6,576,053 B1 | 6/2003 | Kim et al. |
| 6,599,572 B2 | 7/2003 | Saanila et al. |
| 6,613,383 B1 | 9/2003 | George et al. |
| 6,616,982 B2 | 9/2003 | Merrill et al. |
| 6,632,595 B2 | 10/2003 | Kikuchi et al. |
| 6,652,924 B2 | 11/2003 | Sherman |
| 6,706,115 B2 | 3/2004 | Leskela et al. |
| 6,727,169 B1 | 4/2004 | Raaijmakers et al. |
| 6,780,704 B1 | 8/2004 | Raaijmakers et al. |
| 6,794,287 B2 | 9/2004 | Saanila et al. |
| 6,797,340 B2 | 9/2004 | Fang et al. |
| 6,800,383 B1 | 10/2004 | Lakhotkin |
| 6,800,552 B2 | 10/2004 | Elers et al. |
| 6,809,026 B2 | 10/2004 | Yoon et al. |
| 6,821,889 B2 | 11/2004 | Elers et al. |
| 6,827,978 B2 | 12/2004 | Yoon et al. |
| 6,833,161 B2 | 12/2004 | Wang et al. |
| 6,863,727 B1 | 3/2005 | Elers et al. |
| 6,902,763 B1 | 6/2005 | Elers et al. |
| 6,986,914 B2 | 1/2006 | Elers et al. |
| 7,015,153 B1 | 3/2006 | Triyoso et al. |
| 7,045,406 B2 | 5/2006 | Huotari et al. |
| 7,074,690 B1 | 7/2006 | Gauri et al. |
| 7,138,336 B2 | 11/2006 | Lee et al. |
| 7,211,144 B2 | 5/2007 | Lu et al. |
| 7,211,508 B2 | 5/2007 | Chung et al. |
| 7,268,078 B2 | 9/2007 | Iyer |
| 7,329,590 B2 | 2/2008 | Elers et al. |
| 7,405,158 B2 | 7/2008 | Lai et al. |
| 7,410,666 B2 | 8/2008 | Elers et al. |
| 7,416,981 B2 | 8/2008 | Lee et al. |
| 7,611,751 B2 | 11/2009 | Elers |
| 7,749,871 B2 | 7/2010 | Elers et al. |
| 7,794,798 B2 | 9/2010 | Hautala |
| 9,111,746 B2 | 8/2015 | Ranjan et al. |
| 9,171,736 B2 | 10/2015 | Raley et al. |
| 9,425,038 B2 | 8/2016 | Shimizu |
| 9,455,138 B1 | 9/2016 | Fukazawa et al. |
| 9,784,695 B2 | 10/2017 | Blendl |
| 9,786,491 B2 * | 10/2017 | Suzuki .............. H01L 21/02126 |
| 9,786,492 B2 * | 10/2017 | Suzuki .............. H01L 21/02216 |
| 2001/0004479 A1 | 6/2001 | Cheung et al. |
| 2001/0005546 A1 | 6/2001 | Cheung et al. |
| 2001/0024387 A1 | 9/2001 | Raaijmakers et al. |
| 2001/0034097 A1 | 10/2001 | Lim et al. |
| 2001/0041250 A1 | 11/2001 | Werkhoven et al. |
| 2002/0004293 A1 | 1/2002 | Soininen et al. |
| 2002/0104481 A1 | 8/2002 | Chiang et al. |
| 2002/0182320 A1 | 12/2002 | Leskela et al. |
| 2003/0015764 A1 | 1/2003 | Raaijmakers |
| 2003/0026989 A1 | 2/2003 | George et al. |
| 2003/0031793 A1 | 2/2003 | Chang et al. |
| 2003/0049931 A1 | 3/2003 | Byun et al. |
| 2003/0072975 A1 | 4/2003 | Shero et al. |
| 2003/0082296 A1 | 5/2003 | Elers et al. |
| 2003/0104126 A1 | 6/2003 | Fang et al. |
| 2003/0123216 A1 | 7/2003 | Yoon et al. |
| 2003/0127043 A1 | 7/2003 | Lu et al. |
| 2003/0153181 A1 | 8/2003 | Yoon et al. |
| 2003/0157760 A1 | 8/2003 | Xi et al. |
| 2003/0161952 A1 | 8/2003 | Wang et al. |
| 2003/0181035 A1 | 9/2003 | Yoon et al. |
| 2003/0194825 A1 | 10/2003 | Law et al. |
| 2003/0203616 A1 | 10/2003 | Chung et al. |
| 2004/0130029 A1 | 7/2004 | Raaijmakers et al. |
| 2004/0185183 A1 | 9/2004 | Srinivasan et al. |
| 2004/0206008 A1 | 10/2004 | Sung |
| 2004/0208994 A1 | 10/2004 | Harkonen et al. |
| 2004/0224504 A1 | 11/2004 | Gadgil |
| 2004/0231799 A1 | 11/2004 | Lee et al. |
| 2004/0238876 A1 | 12/2004 | Youn et al. |
| 2005/0037557 A1 | 2/2005 | Doczy et al. |
| 2005/0106877 A1 | 5/2005 | Elers et al. |
| 2005/0215008 A1 | 9/2005 | Orlowski et al. |
| 2005/0271813 A1 | 12/2005 | Kher et al. |
| 2006/0019494 A1 | 1/2006 | Cao et al. |
| 2006/0078679 A1 | 4/2006 | Elers et al. |
| 2006/0079090 A1 | 4/2006 | Elers et al. |
| 2006/0079099 A1 | 4/2006 | Nguyen et al. |
| 2006/0165892 A1 | 7/2006 | Weidman |
| 2006/0211224 A1 | 9/2006 | Matsuda et al. |
| 2006/0223300 A1 | 10/2006 | Simka et al. |
| 2006/0240187 A1 | 10/2006 | Weidman |
| 2007/0054046 A1 | 3/2007 | Ishizaka et al. |
| 2011/0262642 A1 | 10/2011 | Xiao et al. |
| 2013/0330935 A1 | 12/2013 | Varadarajan |
| 2015/0303056 A1 | 10/2015 | Varadarajan et al. |
| 2015/0303101 A1 | 10/2015 | Blomberg et al. |
| 2015/0376211 A1 | 12/2015 | Girard et al. |
| 2017/0213726 A1 | 7/2017 | Saley et al. |
| 2017/0309476 A1 | 10/2017 | Venkatasubramanian et al. |

(56) References Cited

U.S. PATENT DOCUMENTS

| | | | |
|---|---|---|---|
| 2017/0323782 | A1* | 11/2017 | Suzuki .................. C23C 16/325 |
| 2017/0365462 | A1 | 12/2017 | Varadarajan |
| 2018/0005814 | A1 | 1/2018 | Kumar et al. |
| 2018/0013078 | A1 | 1/2018 | Lee et al. |

FOREIGN PATENT DOCUMENTS

| | | |
|---|---|---|
| EP | 1 158 070 | 11/2001 |
| EP | 2620440 | 7/2013 |
| JP | H06-037041 | 2/1994 |
| JP | 2004-288979 | 10/2004 |
| JP | 2006-040936 | 2/2006 |
| KR | 2003-0016346 | 2/2003 |
| KR | 2003-0057938 | 7/2003 |
| KR | 2003-0093575 | 12/2003 |
| KR | 2004-0060402 | 7/2004 |
| KR | 2004-0079173 | 9/2004 |
| KR | 2004-0079175 | 9/2004 |
| KR | 2004-0100767 | 12/2004 |
| KR | 2005-0000168 | 1/2005 |
| KR | 2018-0005128 | 1/2018 |
| WO | WO 00/054320 | 9/2000 |
| WO | WO 00/55895 | 9/2000 |
| WO | WO 2006/097525 | 9/2006 |
| WO | WO 2008/137399 | 11/2008 |

OTHER PUBLICATIONS

U.S. Appl. No. 14/255,799, filed Apr. 17, 2014 including prosecution history, including but not limited to, Office Action dated Dec. 1, 2016, Final Office Action dated Aug. 29, 2017, and Advisory Action dated Dec. 21, 2017.
1988RD-0296076 (Nov. 20, 1998), Field effect transistor structure with improved transconductant—contg. spacer-less conducting gate oxide, and tungsten deposited on source and drain, EAST Version 2.0.1.4 Patent-Assignee: Anonymous[ANON], Sep. 19, 2005.
Aarik et al., "Influence of substrate temperature on atomic layer growth and properties of HfO2 thin films", Thin Solid Films, vol. 340, 1999, pp. 110-116.
Alen et al., "Atomic Layer Deposition of Ta(Al)N(C) Thin Films Using Trimethylaluminum as a Reducing Agent", Journal of the Electrochemical Society, vol. 148, No. 10, pp. G566-G571, 2001.
Andricacos et al., Damascene copper electroplating for chip, IBM Jour. Research and Dev., 1998, vol. 42, Issue 5, pp. 567-574.
Bain et al., Deposition of tungsten by plasma enhanced chemical vapour deposition, J. Phys. IV France, 1999, vol. 9, pp. 827-833.
Chang et al, "Chemical Vapor Deposition of Tantalum Carbide and Carbonitride Thin Films from Me3CE=Ta(CH2CMe3)3 (E = Ch, N)," J. Mater. Chem. 13:365-369 (2003).
Kattelus et al., "Layered tantalum-aluminum oxide films deposited by atomic layer epitaxy," Thin Solid Films, Vo. 225, pp. 296-298 (1993).
Kim et al., Atomic-layer-deposited WNxCy thin films as diffusion barrier for copper metallization, Applied Physics Letters, Jun. 23, 2003, vol. 82, Issue 25, pp. 4486-4488.
Nakajima et al., Chemical Vapor Deposition of Tungsten Carbide, Molybdenum Carbide Nitride, and Molybdenum Nitride Films, J. Electrochem. Soc., Jun. 1997, vol. 144, Issue 6, pp. 2096-2100.
Polyakov et al., Growth of GaBN Ternary Solutions by Organometallic Vapor Phase Epitaxy, Journal of Electronic Materials, 1997, vol. 26, Issue 3, pp. 237-242.
U.S. Appl. No. 11/288,872, filed Nov. 28, 2005 including prosecution history, including but not limited to, Office Action dated Jul. 2, 2007, Office Action dated Jan. 30, 2008, Office Action dated Sep. 9, 2008, Office Action dated Dec. 4, 2008, and Office Action dated Aug. 20, 2009.
U.S. Appl. No. 11/591,845, filed Nov. 1, 2006 including prosecution history, including but not limited to, Office Action dated Sep. 4, 2008, Office Action dated May 28, 2009, and Notice of Allowance dated Sep. 4, 2009.
U.S. Appl. No. 14/939,984, filed Nov. 12, 2015 including prosecution history, including but not limited to, Office Action dated Feb. 3, 2017, and Notice of Allowance dated Jun. 7, 2017.
Utriainen et al., "Controlled Electrical Conductivity in SnO2 Thin Films by Oxygen or Hydrocarbon Assisted Atomic Layer Epitaxy," J. Electrochem. Soc. 146(1):189-193 (1999).
Wong et al., Barriers for copper interconnections, Solid State Technology, 1999, pp. 1-7.
Yang et al., Atomic Layer Deposition of Tungsten Film from WF6/B2H6: Nucleation Layer for Advanced Semiconductor Devices, Advanced Metallization Conference 2001 (AMC 2001), Conference Proceedings ULSI XVII@2002 Materials Research Society, 2001, pp. 655-660.
Zhang et al., "High permittivity thin film nanolaminates," Journal of Applied Physics, vol. 87, No. 4, pp. 1921-1924 (2000).
Teo et al., "Pre-treatments applied to oxidized aluminum surfaces to modify the interfacial bonding with bis-1, 2-(triethoxysilyl) ethane (BTSE)—Part I. High-purity Al with native oxide", Applied Surface Science 252(5), 2005, pp. 1293-1304.
Teo et al., "Pre-treatments applied to oxidized aluminum surfaces to modify the interfacial bonding with bis-1,2-(triethoxysilyl) ethane (BTSE)—Part II. Anodized 7075-T6 Al alloy", Applied Surface Science 252(5), 2005, pp. 1305-1312.

* cited by examiner

FORMATION OF SILICON-CONTAINING THIN FILMS

REFERENCE TO RELATED APPLICATIONS

The present application claims priority to U.S. Provisional Application No. 62/427,670, filed Nov. 29, 2016, which is incorporated herein by reference in its entirety.

BACKGROUND

Field

The present disclosure relates generally to the field of semiconductor device manufacturing and, more particularly, to formation of silicon-containing thin films, for example silicon oxycarbide (SiOC) and silicon oxycarbonitride (SiOCN) films.

Background

There is an increasing need for dielectric materials with relatively low dielectric constant (k) values and relatively low acid-based wet etch rates. Silicon oxycarbide or silicon oxycarbonitride may satisfy certain of these requirements. Typically, deposition processes for SiOC and SiOCN films require the use of oxygen plasma.

SUMMARY

According to some aspects, methods of forming a silicon-containing thin film on a substrate in a reaction space by a plasma enhanced atomic layer deposition (PEALD) process are provided. In some embodiments a PEALD process comprises two or more deposition cycles, each comprising contacting a surface of the substrate with a vapor phase silicon precursor comprising a siloxane, and contacting the adsorbed silicon species with at least one reactive species generated by plasma formed from a second reactant comprising hydrogen, wherein the second reactant does not comprise oxygen. The contacting steps may be repeated until a silicon-containing film of a desired thickness has been formed.

In some embodiments the silicon-containing film comprises silicon oxycarbide (SiOC). In some embodiments the silicon-containing film comprises silicon oxycarbonitride (SiOCN).

In some embodiments the silicon precursor comprises a siloxane. In some embodiments the silicon precursor comprises dichloro-tetraisoprpyldisiloxane (TIPDSiCl$_2$). In some embodiments the silicon precursor comprises a malonate compound. In some embodiments the silicon precursor comprises bis(trimethylsilyl) malonate. In some embodiments the silicon precursor comprises bis(dimethyldichlorosilyl) malonate.

In some embodiments the second reactant comprises H$_2$. In some embodiments the second reactant further comprises N$_2$. In some embodiments the second reactant comprises NH$_3$.

In some embodiments the reactive species is generated from a second reactant comprising a noble gas.

In some embodiments the silicon-containing film is deposited on a three-dimensional structure on the substrate.

In some embodiments a method may further comprise contacting the substrate with a vapor phase carbon precursor in at least one deposition cycle. In some embodiments the substrate is contacted with a vapor phase carbon precursor before the substrate is contacted with at least one reactive species generated by plasma formed from a second reactant. In some embodiments the substrate is contacted with the vapor phase carbon precursor after the substrate is contacted with at least one reactive species generated by plasma formed from a second reactant. In some embodiments the method further comprises contacting the substrate with at least one reactive species generated by plasma formed from a second reactant comprising hydrogen after contacting the substrate with the carbon precursor, wherein the second reactant does not comprise oxygen.

According to some aspects, methods for depositing a silicon-containing thin film on a substrate in a reaction space comprising at least one deposition cycle are provided. In some embodiments the deposition cycle comprises contacting a surface of the substrate with a vapor phase silicon precursor comprising two silicon atoms connected by an oxygen atom, removing excess silicon precursor and reaction byproducts, if any, contacting the surface of the substrate with a vapor phase carbon precursor, removing excess carbon precursor and reaction byproducts, if any, contacting a surface of the substrate with a second reactant comprising reactive hydrogen species, and removing excess second reactant and reaction byproducts, if any. The deposition cycle may be repeated two or more times until a silicon-containing thin film of desired thickness has been formed.

In some embodiments the silicon precursor comprises TiPDSiCl$_2$. In some embodiments the silicon precursor comprises bis(trimethylsilyl) malonate. In some embodiments the silicon precursor comprises bis(dimethyldichlorosilyl) malonate.

In some embodiments the carbon precursor comprises an amine. In some embodiments the carbon precursor comprises ethylene diamine.

DETAILED DESCRIPTION

Figure 1:
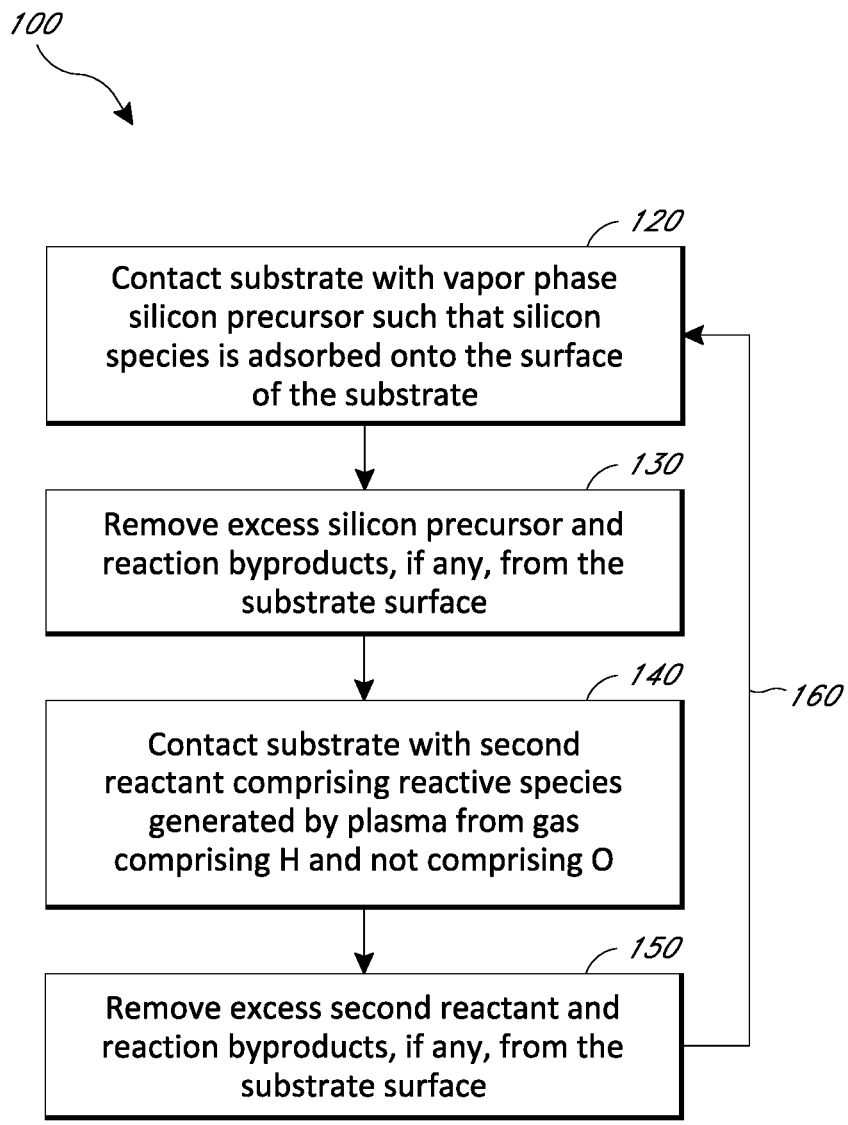
FIG. 1 is a process flow diagram for depositing a silicon-containing thin film by a plasma enhanced atomic layer deposition (PEALD) process according to some embodiments of the present disclosure.

Silicon-containing thin films, such as silicon oxycarbide (SiOC) and silicon oxycarbonitride (SiOCN) films, have a wide variety of applications, including for example in integrated circuit fabrication. In particular, silicon-containing films that display a low etch rate find use in many applications, both in the semiconductor industry and outside of the semiconductor industry. Silicon-containing films may be useful as, for example, etch stop layers, sacrificial layers, low-k spacers, anti-reflection layers (ARL), and passivation layers.

According to some embodiments of the present disclosure, various silicon-containing films, precursors, and methods for depositing said films are provided. In some embodiments the silicon-containing films have a relatively low wet etch rate, for example in dilute hydrofluoric acid solution (dHF). In some embodiments a silicon-containing thin film is deposited over a three dimensional structure, such as a fin in the formation of a finFET device.

In some embodiments silicon-containing thin films are deposited on a substrate by a plasma-enhanced atomic layer deposition (PEALD) process. In some embodiments silicon-containing thin films are not deposited by liquid phase methods. TIn some embodiments no liquid phase precursors or reactants contact the substrate in the deposition process.

In some embodiments films comprising silicon oxygen and carbon are provided, while in some embodiments films comprising silicon, oxygen, carbon and nitrogen are provided. These silicon-containing films are generally referred to herein as SiOC or SiOCN for convenience and simplicity. The films may comprise one or more impurities. Further, as used herein, the terms SiOC and SiOCN are not intended to limit, restrict, or define the bonding or chemical state, for example the oxidation state of any of Si, O, C, N and/or any other element in the film. Further, in some embodiments, where indicated, silicon-containing thin films may comprise one or more elements that are not impurities in addition to Si, O, C, and/or N.

In some embodiments the silicon-containing films may comprise Si—C bonds and/or Si—O bonds. In some embodiments the silicon-containing films may comprise Si—C bonds, Si—N bonds, and/or Si—O bonds. In some embodiments the silicon-containing films may comprise Si—C bonds and/or Si—O bonds and do not comprise Si—N bonds.

In some embodiments the silicon-containing films may comprise more Si—O bonds than Si—C bonds. For example in some embodiments a ratio of Si—O bonds to Si—C bonds may be from about 1:1 to about 10:1. In some embodiments the silicon-containing film may comprise from about 0% to about 40% carbon on an atomic basis. In some embodiments the silicon-containing film may comprise carbon at the lowest detection level up to about 40% on an atomic basis. In some embodiments the silicon-containing film may comprise from about 0.1% to about 40%, from about 0.5% to about 30%, from about 1% to about 30%, or from about 5% to about 20% carbon on an atomic basis. In some embodiments the silicon-containing films do not comprise carbon.

In some embodiments the silicon-containing films may comprise more Si—O bonds than Si—N bonds, for example a ratio of Si—O bonds to Si—N bonds may be from about 1:1 to about 10:1. In some embodiments the silicon-containing films may comprise from about 0% to about 40% nitrogen on an atomic basis. In some embodiments the silicon-containing film may comprise nitrogen at the lowest detection level up to about 40% on an atomic basis. In some embodiments the silicon-containing films may comprise from about 0.1% to about 40%, from about 0.5% to about 30%, from about 1% to about 30%, or from about 5% to about 20% nitrogen on an atomic basis. In some embodiments the silicon-containing films do not comprise nitrogen.

In some embodiments the silicon-containing films may comprise from about 0% to about 70% oxygen on an atomic basis. In some embodiments the silicon-containing film may comprise oxygen at the lowest detection level up to about 70% on an atomic basis. In some embodiments the silicon-containing films may comprise from about 10% to about 70%, from about 15% to about 50%, or from about 20% to about 40% oxygen on an atomic basis. In some embodiments the silicon-containing films do not comprise oxygen.

In some embodiments the silicon-containing films may comprise about 0% to about 50% silicon on an atomic basis. In some embodiments the silicon-containing film may comprise silicon at the lowest detection level up to about 50% on an atomic basis. In some embodiments the silicon-containing films may comprise from about 10% to about 50%, from about 15% to about 40%, or from about 20% to about 35% silicon on an atomic basis.

As mentioned above, in some embodiments a silicon-containing thin film is deposited by an atomic layer deposition (ALD)-type process. ALD-type processes are based on controlled, generally self-limiting surface reactions. Gas phase reactions are typically avoided by contacting the substrate alternately and sequentially with the reactants. Vapor phase precursors or reactants are separated from each other in the reaction chamber, for example, by removing excess reactants and/or reactant byproducts between reactant pulses. The reactants may be removed from proximity with the substrate surface with the aid of a purge gas and/or vacuum. In some embodiments excess reactants and/or reactant byproducts are removed from the reaction space by purging, for example with an inert gas.

In some embodiments, plasma enhanced ALD (PEALD) processes are used to deposit silicon-containing films, in which at least one plasma reactant is used. In some embodiments PEALD processes as described herein do not use oxygen plasma. In some embodiments PEALD processes as described herein do not include a reactant comprising oxygen plasma. In some embodiments PEALD processes as described herein may use nitrogen-containing plasma. In some embodiments PEALD processes as described herein may include a reactant comprising nitrogen plasma. In some embodiments PEALD processes as described herein may use hydrogen-containing plasma. In some embodiments PEALD processes as described herein may include a reactant comprising hydrogen plasma. In some embodiments PEALD processes as described herein may include a reactant comprising nitrogen plasma and hydrogen plasma.

Briefly, a substrate or workpiece is placed in a reaction chamber and subjected to alternately repeated surface reactions. In some embodiments, thin silicon-containing films are formed by repetition of an ALD cycle. In some embodiments the ALD deposition cycle is self-limiting. In some embodiments, for forming silicon-containing films, each ALD cycle comprises at least two distinct phases. The contacting and removal of a reactant or precursor from the substrate may be considered a phase.

In a first phase, also referred to as a silicon phase, a vapor phase first reactant or precursor comprising silicon contacts the substrate and forms no more than about one monolayer of silicon-containing species on the substrate surface. This reactant is also referred to herein as "the silicon precursor," "silicon-containing precursor," or "silicon reactant" and may be, for example, dichloro-tetraisopropyldisiloxane ($TIPDSiCl_2$), or other precursor disclosed herein.

In some embodiments excess first vapor phase reactant and any reaction byproducts are removed from the proximity of the substrate surface. For example, the first vapor phase reactant and any reaction byproducts may be removed from proximity with the substrate surface with the aid of a purge gas and/or vacuum. In some embodiments excess reactant and/or reactant byproducts are removed from the reaction space by purging, for example with an inert gas. In some embodiments the substrate may be moved in order to facilitate removal of the reactant and/or reactant byproducts, for example by moving the substrate to a different reaction chamber.

In a second phase, also referred to as a plasma phase, or RF phase, a second reactant comprising a reactive species contacts the substrate and may convert adsorbed silicon species to a silicon-containing material. In some embodiments the second reactant comprises hydrogen. In some embodiments the second reactant comprises nitrogen. In some embodiments the second reactant comprises hydrogen and nitrogen.

In some embodiments, the reactive species comprises an excited species. In some embodiments the second reactant comprises a species from a hydrogen containing plasma. In some embodiments, the second reactant comprises hydrogen radicals, hydrogen atoms and/or hydrogen plasma. In some embodiments the second reactant comprises a species from a nitrogen containing plasma. In some embodiments, the second reactant comprises nitrogen radicals, nitrogen atoms and/or nitrogen plasma. In some embodiments the second reactant comprises a species from a hydrogen- and nitrogen-containing plasma.

The second reactant may comprise other species that are not hydrogen species. In some embodiments the second reactant does not comprise hydrogen species. In some embodiments, the second reactant may comprise a species from a noble gas, such as He, Ne, Ar, Kr, or Xe, for example as radicals, in plasma form, or in elemental form. These reactive species from noble gases do not necessarily contribute material to the deposited film, but can in some circumstances contribute to film growth as well as help in the formation and ignition of plasma.

In some embodiments a second reactant is formed by generating a plasma in a flowing gas. In some embodiments a gas that is used to form a plasma may flow constantly throughout the deposition process but only be activated intermittently.

In some embodiments a gas that is used to form a plasma does not comprise oxygen. In some embodiments any adsorbed silicon precursor is not contacted with a reactive species generated by a plasma from oxygen. In some embodiments a second reactant comprising reactive species is generated in a gas that does not comprise oxygen. In some embodiments the second reactant is not an oxidizing gas. For example, in some embodiments a second reactant may comprise a plasma generated in a gas that does not comprise oxygen. In some embodiments the second reactant may be generated in a gas comprising less than about 50 atomic % (at %) oxygen, less than about 30 at % oxygen, less than about 10 at % oxygen, less than about 5 at % oxygen, less than about 1 at % oxygen, less than about 0.1 at % oxygen, less than about 0.01 at % oxygen, or less than about 0.001 at % oxygen.

In some embodiments silicon-containing films deposited by processes described herein that utilize a second reactant that does not comprise oxygen plasma can have a higher concentration of C and/or N than a silicon-containing film deposited by a similar PEALD process that does include a reactant comprising oxygen plasma. Without being bound by any one theory, it is believed that the lack of oxygen containing plasma in the second reactant results in increased retention of C and/or N, which may be present in a silicon precursor, in the final silicon-containing film.

In some embodiments a second reactant does not comprise nitrogen plasma. In some embodiments a gas that is used to form a plasma does not comprise nitrogen. In some embodiments the adsorbed silicon precursor is not contacted with a reactive species generated by a plasma from nitrogen. In some embodiments a second reactant comprising reactive species is prepared by generating a plasma in a gas that does not comprise nitrogen. For example in some embodiments a second reactant may comprise a plasma generated in a gas that does not comprise nitrogen.

However, in some embodiments a gas that is used to form a plasma may comprise nitrogen. In some other embodiments the second reactant may comprise nitrogen radicals, nitrogen atoms and/or nitrogen plasma. In some embodiments the second reactant may comprise a plasma generated in a gas comprising less than about 25 atomic % (at %) nitrogen, less than about 20 at % nitrogen, less than about 15 at % nitrogen, less than about 10 at % nitrogen, less than about 5 at % nitrogen, less than about 1 at % nitrogen, less than about 0.1 at % nitrogen, less than about 0.01 at % nitrogen, or less than about 0.001 at % nitrogen.

In some embodiments the second reactant may comprise a plasma generated in a gas comprising hydrogen and nitrogen. For example the second reactant may comprise a plasma generated in a gas comprising $H_2$ and $N_2$. In some embodiments the second reactant may comprise $H_2$ and $N_2$. In some embodiments the second reactant comprise a plasma generated in a gas having a ratio of $H_2$ to $N_2$ ($H_2/N_2$) of less than about 20%, less than about 15%, less than about 10%, or less than about 5%.

In some embodiments a gas that is used to form a plasma does not comprise nitrogen or oxygen. In some embodiments adsorbed silicon precursor is not contacted with a reactive species generated by a plasma from nitrogen or oxygen. In some embodiments a second reactant comprising reactive species is generated in a gas that does not comprise nitrogen or oxygen. For example in some embodiments a second reactant may comprise a plasma generated in a gas that does not comprise nitrogen or oxygen.

In some embodiments excess second reactant and any reaction byproducts are removed from the proximity of the substrate surface. The second reactant and any reaction byproducts may be removed from proximity with the substrate surface with the aid of a purge gas and/or vacuum. In some embodiments excess reactant and/or reactant byproducts are removed from the reaction space by purging, for example with an inert gas. In some embodiments the substrate may be moved in order to facilitate removal of the reactant and/or reactant byproducts, for example by moving the substrate to a different reaction chamber.

In some embodiments a gas that is used to form the reactive species or plasma may also be used as a purge gas. For example, the purge gas may comprise gas that is used to form the second reactant. The gas may be activated at one or more intervals to form the reactive species, for example by generating a plasma in the gas. The power may be turned off at other times such that the gas can serve as a purge gas, or even as a carrier gas for another reactant. In some embodiments gas that is used to form reactive species or plasma may be flown continuously into the reaction chamber throughout one or more cycle.

Additional phases may be added and phases may be removed as desired to adjust the composition of the final film that is deposited. For example, in some embodiments, after a silicon phase has been conducted a carbon phase may be conducted using a second, different precursor comprising carbon. In some embodiments this carbon phase may be conducted after a silicon phase and before a plasma phase is conducted. In some embodiments a silicon phase may be conducted, followed by a plasma phase, further followed by a carbon phase that is conducted using a second, different precursor comprising carbon. In some embodiments the carbon phase may be followed by a second plasma phase.

One or more of the reactants may be provided with the aid of a carrier gas, such as Ar or He. In some embodiments the silicon precursor and the second reactant are provided with the aid of a carrier gas.

In some embodiments, two of the phases may overlap, or be combined. For example, the silicon precursor and the second reactant may be contacting the substrate simultaneously in phases that partially or completely overlap. In addition, although referred to as the first and second phases, and the first and second reactants, the order of the phases may be varied, and an ALD cycle may begin with any one of the phases. That is, unless specified otherwise, the reactants can contact the substrate in any order, and the process may begin with any of the reactants.

As discussed in more detail below, in some embodiments for depositing a silicon-containing film, one or more deposition cycles begin by contacting the substrate with the silicon precursor, followed by the second reactant. In some embodiments deposition may begin by contacting the substrate with the second reactant, followed by the silicon precursor. In some embodiments for depositing a silicon-containing film, one or more deposition cycles begin by contacting the substrate with a silicon precursor, followed by a second, different precursor comprising carbon, further followed by the second reactant. In some embodiments for depositing a silicon-containing film, one or more deposition cycles begin by contacting the substrate with a silicon precursor, followed by the second reactant, followed by a second, different,carbon precursor, and further followed by the second reactant.

In some embodiments the substrate on which deposition is desired, such as a semiconductor workpiece, is loaded into a reaction space or reactor. The reactor may be part of a cluster tool in which a variety of different processes in the formation of an integrated circuit are carried out. In some embodiments a flow-type reactor is utilized. In some embodiments a shower head type of reactor is utilized. In some embodiments, a space divided reactor is utilized. In some embodiments a high-volume manufacturing-capable single wafer ALD reactor is used. In other embodiments a batch reactor comprising multiple substrates is used. For embodiments in which batch ALD reactors are used, the number of substrates may be, for example, in the range of 10 to 200, in the range of 50 to 150, or in the range of 100 to 130.

Examples of suitable reactors that may be used include commercially available equipment such as Pulsar® reactors, for example the Pulsar® 2000 and the Pulsar® 3000, the EmerALD® reactors and the Advance® 400 Series reactors, available from ASM America, Inc of Phoenix, Ariz. and ASM Europe B. V., Almere, Netherlands. Other commercially available reactors include those from ASM Japan K. K (Tokyo, Japan) under the tradename Eagle® XP and XP8.

In some embodiments, if necessary, the exposed surfaces of the workpiece can be pretreated to provide reactive sites to react with the first phase of the ALD process. In some embodiments a separate pretreatment step is not required. In some embodiments the substrate is pretreated to provide a desired surface termination. In some embodiments the substrate is pretreated with plasma.

Excess reactant and reaction byproducts, if any, are removed from the vicinity of the substrate, and in particular from the substrate surface, between reactant contacting phases. In some embodiments excess reactant and reaction byproducts, if any, are removed from the substrate surface by, for example, purging the reaction chamber between reactant contacting phases, such as by purging with an inert gas. In some embodiments the reaction chamber may be purged with a gas comprising the gas from which the second reactant may be generated. That is, in some embodiments the gas from which the second reactant may be generated or formed is flown into the reaction chamber throughout an entire cycle. The flow rate and contacting time of each reactant is tunable, as is the removal step, allowing for control of the quality and various properties of the films.

As mentioned above, in some embodiments a gas is provided to the reaction chamber continuously during each deposition cycle, or during the entire ALD process, and reactive species are provided by generating a plasma in the gas, either in the reaction chamber or upstream of the reaction chamber. In some embodiments the gas does not comprise oxygen. In some embodiments the gas may comprise a noble gas, such as helium or argon. In some embodiments the gas is helium. In some embodiments the gas is argon. In some embodiments the gas may comprise hydrogen. In some embodiments the gas may comprise nitrogen. In some embodiments the gas may comprise hydrogen and nitrogen. The flowing gas may also serve as a purge gas for the first and/or second reactant (or reactive species). For example, flowing hydrogen may serve as a purge gas for a first silicon precursor and also serve as a second reactant (as a source of reactive species). In some embodiments, hydrogen-containing gas, nitrogen-containing gas, and/or hydrogen and nitrogen containing gas may serve as a purge gas for a first precursor and a source of excited species for converting a precursor to the silicon-containing film. In some embodiments the gas in which the plasma is generated does not comprise oxygen and the adsorbed precursor is not contacted with a reactive species generated by a plasma from oxygen. In some embodiments the gas in which the plasma is generated does not comprise nitrogen and the adsorbed precursor is not contacted with a reactive species generated by a plasma from nitrogen. In some embodiments the gas in which the plasma is generated does not comprise oxygen or nitrogen and the adsorbed precursor is not contacted with a reactive species generated by a plasma from oxygen or nitrogen.

The cycle is repeated until a film of the desired thickness and composition is obtained. In some embodiments the deposition parameters, such as the precursor flow rate, contacting time, removal time, and/or reactants themselves, may be varied in one or more deposition cycles during the ALD process in order to obtain a film with the desired characteristics.

In some embodiments the surface of the substrate is contacted with a reactant. In some embodiments a pulse of reactant is provided to a reaction space containing the substrate. The term "pulse" may be understood to comprise feeding reactant into the reaction chamber for a predetermined amount of time. The term "pulse" does not restrict the length or duration of the pulse and unless indicated otherwise a pulse can be any length of time. In some embodiments the substrate is moved to a reaction space containing a reactant. In some embodiments after exposure to the first reactant the substrate is subsequently moved from the reaction space containing the first reactant to a second, different reaction space containing the second reactant. The substrate may be moved between the first and second reaction space to carry out multiple deposition cycles.

In some embodiments, a deposition cycle begins by contacting the substrate with a silicon reactant first. In some embodiments an initial surface termination may be formed on the substrate surface prior to beginning the deposition cycle. After an initial surface termination, if necessary or desired, the substrate is contacted with a silicon reactant. In some embodiments a first silicon reactant pulse is supplied to the workpiece. In accordance with some embodiments, the first reactant pulse comprises a carrier gas flow and a volatile silicon species, such as $TIPDSiCl_2$, that is reactive with the workpiece surfaces of interest. Accordingly, silicon-containing species adsorb upon these workpiece surfaces. In some embodiments the first reactant pulse self-saturates the workpiece surfaces with silicon reactant species such that any excess constituents of the first reactant pulse do not further react with the molecular layer formed by this process.

In some embodiments the substrate is contacted with a second carbon precursor. In some embodiments a second carbon reactant pulse is supplied to the workpiece. In accordance with some embodiments, the second reactant pulse comprises a carrier gas flow and a volatile species, such as ethylene diamine, that is reactive with the workpiece surfaces of interest. Accordingly, carbon-containing species adsorb upon these workpiece surfaces. In some embodiments the second reactant pulse may self-saturates the workpiece surfaces with carbon reactant species such that any excess constituents of the second reactant pulse do not further react with the molecular layer formed by this process.

Precursor pulses can be supplied in gaseous form. A precursor gas is considered "volatile" for purposes of the present description if the species exhibits sufficient vapor pressure under the process conditions to transport the species to the workpiece in sufficient concentration to saturate exposed surfaces.

In some embodiments the silicon or carbon reactant contacts the surface from about 0.05 seconds to about 5.0 seconds, about 0.1 seconds to about 3 seconds or about 0.2 seconds to about 1.0 seconds. The optimum contacting time can be readily determined by the skilled artisan based on the particular circumstances.

After sufficient time for about a molecular layer of silicon species to adsorb on the substrate surface, excess silicon reactant, and reaction byproducts, if any, are removed from the substrate surface. In some embodiments removing excess reactant and reaction byproducts, if any, may comprise purging the reaction chamber. In some embodiments the reaction chamber may be purged by stopping the flow of the silicon reactant while continuing to flow a carrier gas or purge gas for a sufficient time to diffuse or purge excess reactants and reactant by-products, if any, from the reaction space. In some embodiments excess silicon precursor is purged with the aid of one or more inert gases, such as helium or argon. In some embodiments the inert gas is flowing throughout the ALD cycle. In some embodiments the substrate may be moved from the reaction space containing the silicon reactant to a second, different reaction space. In some embodiments, the silicon reactant is removed for about 0.1 seconds to about 10 seconds, about 0.3 seconds to about 5 seconds or about 0.3 seconds to about 1 second.

Contacting and removal of a silicon reactant can be considered a silicon phase of the ALD cycle. In some embodiments an ALD cycle may comprise one or more silicon phases. In some embodiments each silicon phase may include a different silicon precursor.

In the second phase, a second reactant comprising a reactive species, such as hydrogen and nitrogen containing plasma is provided to the workpiece. Hydrogen and nitrogen containing plasma may be formed by generating a plasma in a gas comprising hydrogen and nitrogen, for example, $NH_3$, in the reaction chamber or upstream of the reaction chamber, for example by flowing the $NH_3$ through a remote plasma generator. In some embodiments the gas is provided to the reaction chamber continuously and hydrogen and nitrogen containing plasma, atoms or radicals are created or supplied when needed.

In some embodiments, plasma is generated in flowing $NH_3$ gas. In some embodiments $NH_3$ is provided to the reaction chamber before the plasma is ignited or hydrogen atoms or radicals are formed. In some embodiments the $NH_3$ is provided to the reaction chamber continuously and hydrogen and nitrogen containing plasma, atoms or radicals are created or supplied when needed.

Typically, the second reactant, for example, comprising hydrogen and nitrogen containing plasma, contacts the substrate for about 0.1 seconds to about 10 seconds. In some embodiments the second reactant, such as hydrogen and nitrogen containing plasma, contacts the substrate for about 0.1 seconds to about 10 seconds, 0.5 seconds to about 5 seconds or 0.5 seconds to about 2.0 seconds. However, depending on the reactor type, substrate type and its surface area, the second reactant contacting time may be even higher than about 10 seconds. In some embodiments, contacting times can be on the order of minutes. The optimum contacting time can be readily determined by the skilled artisan based on the particular circumstances.

In some embodiments plasma, for example hydrogen and nitrogen containing plasma may be generated by applying RF power of from about 10 W to about 2000 W, from about 50 W to about 1000 W, or from about 100 W to about 500 W. In some embodiments the RF power density may be from about 0.02 $W/cm^2$ to about 2.0 $W/cm^2$, or from about 0.05 $W/cm^2$ to about 1.5 $W/cm^2$. The RF power may be applied to a second reactant that flows during the plasma contacting time, that flows continuously through the reaction chamber, and/or that flows through a remote plasma generator. Thus in some embodiments the plasma is generated in situ, while in other embodiments the plasma is generated remotely. In some embodiments a showerhead reactor is utilized and plasma is generated between a susceptor (on top of which the substrate is located) and a showerhead plate. In some embodiments the gap between the susceptor and showerhead plate is from about 0.1 cm to about 20 cm, from about 0.5 cm to about 5 cm, or from about 0.8 cm to about 3.0 cm.

After a time period sufficient to completely saturate and react the previously adsorbed molecular layer of species with the plasma pulse, any excess reactant and reaction byproducts are removed from the substrate surface.

In some embodiments removing excess reactant and reaction byproducts, if any, may comprise purging the reaction chamber. In some embodiments the reaction chamber may be purged by stopping the flow of the second reactant while continuing to flow a carrier gas or purge gas for a sufficient time to diffuse or purge excess reactants and reactant by-products, if any, from the reaction space. In some embodiments the excess second precursor is purged with the aid of inert gas, such as helium or argon. The inert gas may be flowing throughout the ALD cycle. In some embodiments the substrate may be moved from the reaction space containing the second reactant to a different reaction space. The removal may, in some embodiments, be for a period of time from about 0.1 seconds to about 10 seconds, about 0.1 seconds to about 4 seconds or about 0.1 seconds to about 0.5 seconds. Together, the reactive species contacting and removal represent a second, reactive species phase in a silicon-containing thin film atomic layer deposition cycle.

These phases together represent one ALD cycle, which is repeated to form silicon-containing thin films of a desired thickness. While the ALD cycle is generally referred to herein as beginning with the silicon phase, it is contemplated that in other embodiments the cycle may begin with the reactive species phase. One of skill in the art will recognize that the first precursor phase generally reacts with the termination left by the last phase in the previous cycle. Thus, while no reactant may be previously adsorbed on the substrate surface or present in the reaction space if the reactive species phase is the first phase in the first ALD cycle, in subsequent cycles the reactive species phase will effectively follow a silicon phase. In some embodiments one or more different ALD cycles are provided in the deposition process.

According to some embodiments of the present disclosure, PEALD reactions may be performed at temperatures ranging from about 25° C. to about 700° C., from about 50° C. to about 600° C., from about 100° C. to about 500° C., or from about 300° C. to about 450° C. In some embodiments, the optimum reactor temperature may be limited by the maximum allowed thermal budget. Therefore, in some embodiments the reaction temperature is from about 300° C. to about 500° C. In some applications, the maximum temperature is around about 400° C., and, therefore the PEALD process is run at that reaction temperature.

The substrate on which a thin film is deposited may comprise various types of materials. In some embodiments the substrate may comprise an integrated circuit workpiece. In some embodiments the substrate may comprise silicon. In some embodiments the substrate may comprise silicon oxide, for example, thermal oxide. In some embodiments the substrate may comprise a high-k dielectric material. In some embodiments the substrate may comprise carbon. For example the substrate may comprise an amorphous carbon layer, graphene, and/or carbon nanotubes.

In some embodiments the substrate may comprise a metal, including, but not limited to W, Cu, Ni, Co, and/or Al. In some embodiments the substrate may comprise a metal nitride, including, but not limited to TiN and/or TaN. In some embodiments the substrate may comprise a metal carbide, including, but not limited to TiC and/or TaC. In some embodiments the substrate may comprise a metal chalcogenide, including, but not limited to $MoS_2$, $Sb_2Te_3$, and/or GeTe. In some embodiments the substrate may comprise a material that would be oxidized by exposure to an oxygen plasma process, but not by a PEALD process as described herein.

According to some embodiments of the present disclosure, the pressure of the reaction chamber during processing is maintained at from about 0.01 Torr to about 50 Torr, or from about 0.1 Torr to about 10 Torr. In some embodiments the pressure of the reaction chamber is from about 2 Torr to about 5 Torr. In some embodiments the pressure of the reaction chamber may be, for example, about 3 Torr. In some embodiments, a silicon-containing thin film deposition process can be performed at pressures of about 20 Torr or greater.

PEALD of Silicon-Containing Films

As mentioned above, and discussed in more detail below, in some embodiments silicon-containing thin films can be deposited on a substrate in a reaction space by a plasma enhanced atomic deposition layer (PEALD) process. According to some embodiments, a silicon-containing thin film is deposited using a PEALD process on a substrate having three-dimensional features, such as in a FinFET application. In some embodiments a PEALD process as described herein may be used in a variety of applications. For example, a PEALD process as described herein may be used in the formation of hardmask layers, sacrificial layers, protective layers, or low-k spacers. A PEALD process as described herein may be used in, for example, memory device applications.

In some embodiments a silicon-containing thin film may be deposited by a PEALD process that does not include oxygen plasma, which may allow for deposition of a silicon-containing film having a higher concentration of C and/or N as compared to a film deposited by a process that uses oxygen plasma. In some embodiments a silicon-containing thin film may be deposited by a PEALD process that does not include oxygen plasma, which may allow for greater control over the amount of C and/or N present in the final silicon-containing film as compared to a film deposited by a PEALD process utilizing oxygen plasma.

Referring to FIG. 1 and according to some embodiments a silicon-containing thin film is deposited on a substrate in a reaction space by a PEALD deposition process 100 comprising one or more deposition cycles (steps 120-150) comprising:

contacting the substrate with a vapor phase silicon precursor at step 120 such that silicon-containing species adsorb onto the surface of the substrate;

removing excess silicon precursor and reaction byproducts, if any, from the substrate surface at step 130;

contacting the substrate with a second reactant comprising reactive species generated by plasma from a gas that does not comprise oxygen at step 140, thereby converting the adsorbed silicon species into a silicon-containing material;

removing excess second reactant and reaction byproducts, if any, from the substrate surface at step 150; and optionally repeating the deposition cycle (comprising contacting and removing steps) at step 160 to form a silicon-containing thin film of a desired thickness and composition.

In some embodiments step 140 may comprise remotely generating or forming plasma or reactive species before contacting the substrate with the second reactant.

According to some embodiments a plasma enhanced ALD deposition cycle can be used to deposit a silicon-containing thin film. In certain embodiments, a silicon-containing thin film is formed on a substrate by an ALD-type process comprising multiple silicon-containing material deposition cycles, each silicon-containing material deposition cycle comprising:

contacting a substrate with a vapor phase silicon precursor such that silicon-containing species adsorb on the substrate surface;

exposing the substrate to a purge gas and/or vacuum;

contacting the substrate with reactive species generated by forming a plasma in a second reactant comprising hydrogen, wherein the second reactant may also comprise nitrogen but does not comprise oxygen; and exposing the substrate to a purge gas and/or vacuum;

optionally repeating the contacting and exposing steps until a silicon-containing thin film of a desired thickness and composition is obtained.

Figure 2:
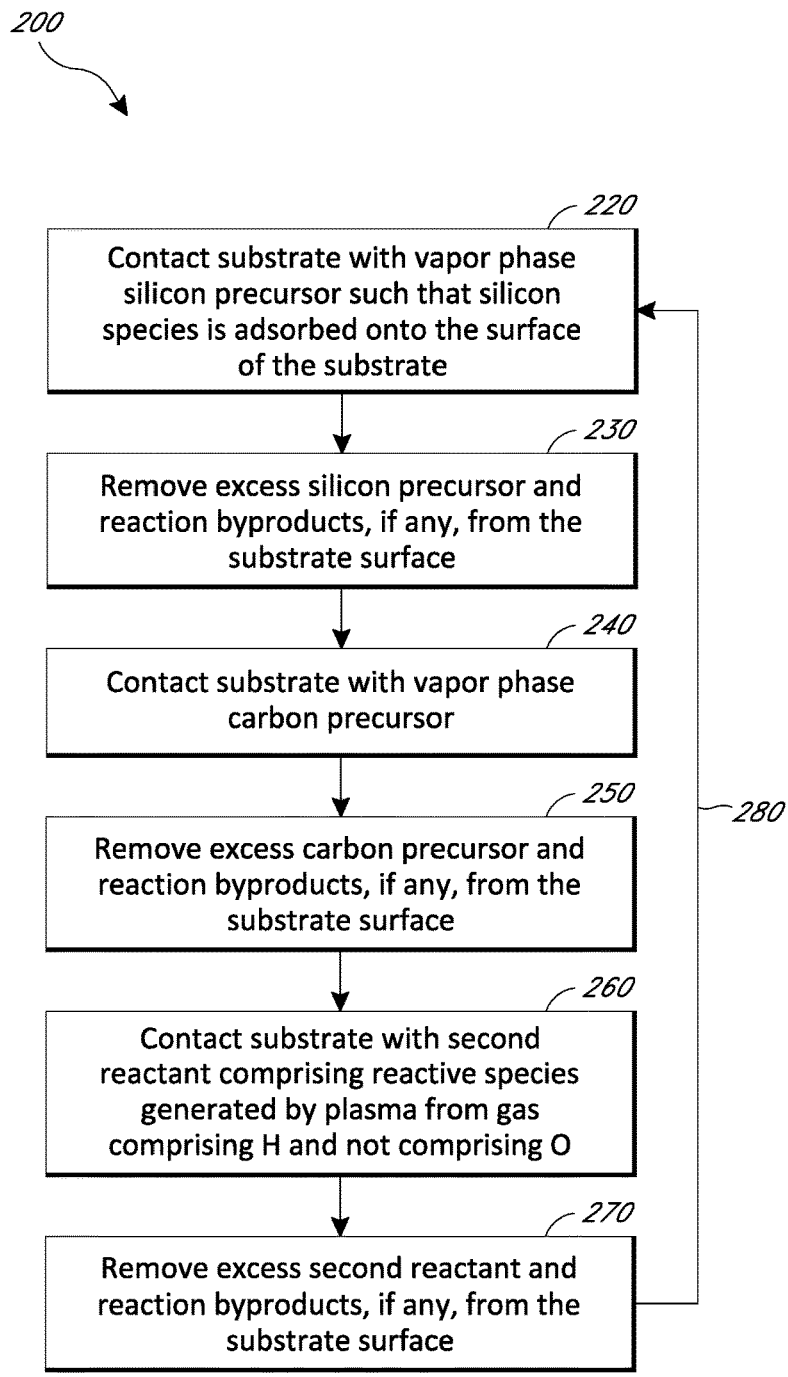
FIG. 2 is a process flow diagram for depositing a silicon-containing thin film by a PEALD process according to some embodiments of the present disclosure.

Referring to FIG. 2 and according to some embodiments a silicon-containing thin film is deposited on a substrate in a reaction space by a PEALD deposition process 200 comprising one or more deposition cycles (220-270) comprising:

contacting the substrate with a vapor phase silicon precursor at step 220 such that silicon-containing species adsorb onto the surface of the substrate;

removing excess silicon precursor and reaction byproducts, if any, from the substrate surface at step 230;

contacting the substrate with a vapor phase carbon precursor at step 240;

removing excess carbon precursor and reaction byproducts, if any, from the substrate surface at step 250;

contacting the substrate with a reactant comprising reactive species generated by plasma from a gas that does not comprise oxygen at step 260, thereby converting adsorbed species into a silicon-containing material;

removing excess second reactant and reaction byproducts, if any, from the substrate surface at step 270; and optionally repeating the deposition cycle (comprising the contacting and removing steps) at step 280 to form a silicon-containing thin film of a desired thickness and composition.

In some embodiments step 260 may comprise remotely generating or forming plasma or reactive species before contacting the substrate with the second reactant. In some embodiments the gas from which the second reactant is generated may be flowed continuously into the reaction space during the entire deposition cycle. In some embodiments the gas from which the second reactant is generated may be flowed or pulsed into the reaction space after the substrate has been contacted with the carbon precursor and the carbon precursor has been removed.

In some embodiments step 260 may comprise generating the second reactant by a plasma from a gas that is flowed continuously into the reaction space during the deposition cycle. In some embodiments step 260 may comprise flowing a gas from which the second reactant is to be generated into the reaction space for a duration and then generating the second reactant by a plasma. In some embodiments step 270 may comprise continuously flowing the gas from which the second reactant is generated into the reaction space while a plasma is no longer generated. In some other embodiments step 270 may comprise removing or purging the gas from which the second reactant is generated from the reaction space.

According to some embodiments a plasma enhanced ALD deposition cycle can be used to deposit a silicon-containing thin film. In certain embodiments, a silicon-containing thin film is formed on a substrate by an ALD-type process comprising multiple silicon-containing material deposition cycles, each silicon-containing material deposition cycle comprising:

contacting a substrate with a vapor phase silicon precursor such that a silicon compound adsorbs on the substrate surface;

exposing the substrate to a purge gas and/or vacuum;

contacting a substrate with a vapor phase carbon precursor;

exposing the substrate to a purge gas and/or vacuum;

contacting the substrate with reactive species generated by forming a plasma in a second reactant gas comprising hydrogen and that does not comprise oxygen; and exposing the substrate to a purge gas and/or vacuum;

optionally repeating the contacting and exposing steps until a silicon-containing thin film of a desired thickness and composition is obtained.

In some embodiments the second reactant gas may comprise hydrogen and nitrogen.

Figure 3:
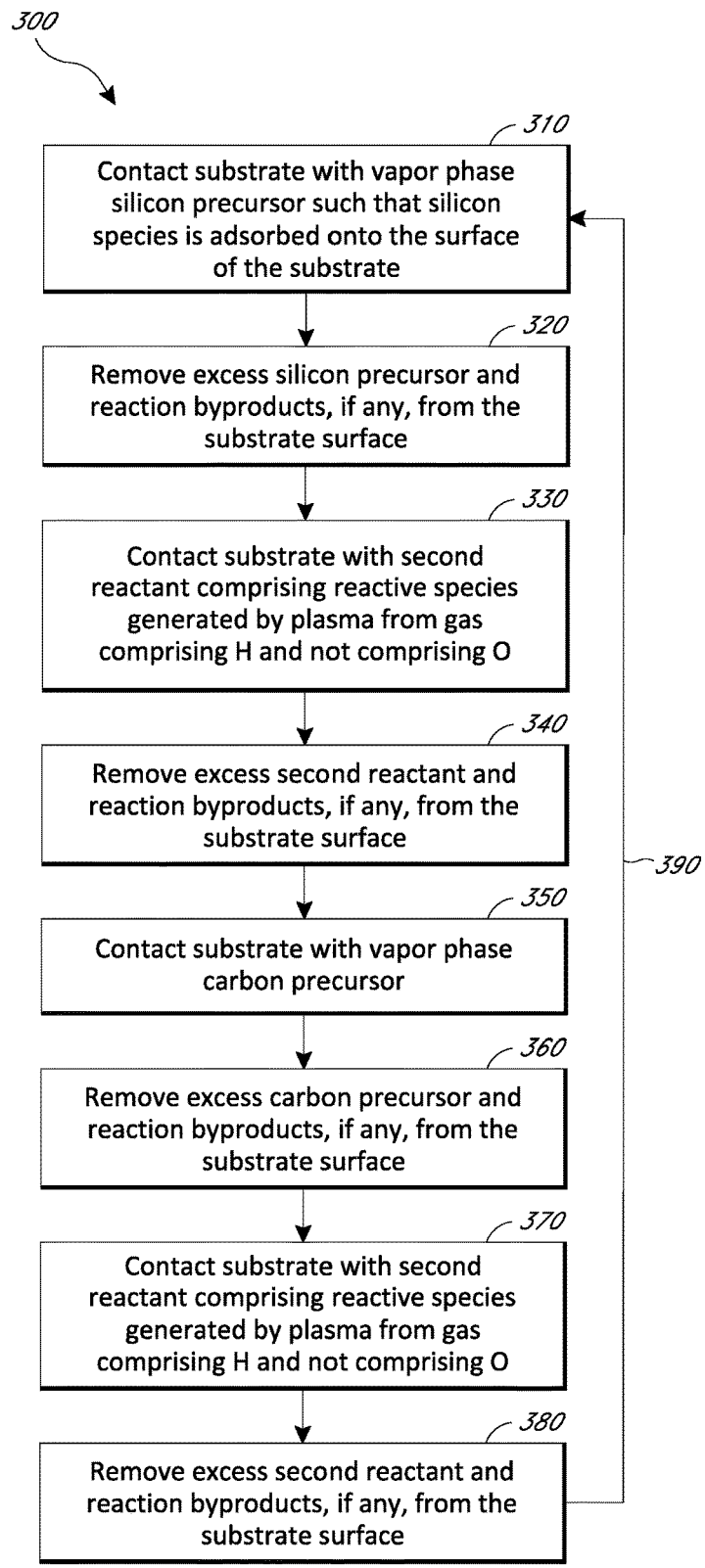
FIG. 3 is a process flow diagram for depositing a silicon-containing thin film by a PEALD process according to some embodiments of the present disclosure.

Referring to FIG. 3 and according to some embodiments a silicon-containing thin film is deposited on a substrate in a reaction space by a PEALD deposition process 300 comprising one or more deposition cycles (steps 310-380) comprising:

contacting the substrate with a vapor phase silicon precursor at step 310 such that silicon species adsorb onto the surface of the substrate;

removing excess silicon precursor and reaction byproducts, if any, from the substrate surface at step 320;

contacting the substrate with a second reactant comprising reactive species generated by plasma from a gas that does not comprise oxygen at step 330;

removing excess second reactant and reaction byproducts, if any, from the substrate surface at step 340;

contacting the substrate with a vapor phase carbon precursor at step 350;

removing excess carbon precursor and reaction byproducts, if any, from the substrate surface at step 360;

contacting the substrate with a second reactant comprising reactive species generated by plasma from a gas that does not comprise oxygen at step 370; and removing excess second reactant and reaction byproducts, if any, from the substrate surface at step 380.

The ALD cycle may optionally be repeated at step 390 to form a silicon-containing thin film of a desired thickness and composition.

In some embodiments steps 330 and/or 370 may comprise remotely generating or forming plasma or reactive species before contacting the substrate with the second reactant.

According to some embodiments a plasma enhanced ALD deposition cycle can be used to deposit a silicon-containing thin film. In certain embodiments, a silicon-containing thin film is formed on a substrate by an ALD-type process comprising multiple silicon-containing material deposition cycles, each silicon-containing material deposition cycle comprising:

contacting a substrate with a vapor phase silicon precursor such that a silicon-containing species adsorbs on the substrate surface;

exposing the substrate to a purge gas and/or vacuum;

contacting the substrate with reactive species generated by forming a plasma in a second reactant comprising hydrogen that may also comprise nitrogen and that does not comprise oxygen;

exposing the substrate to a purge gas and/or vacuum;

contacting a substrate with a vapor phase carbon precursor;

exposing the substrate to a purge gas and/or vacuum;

contacting the substrate with reactive species generated by forming a plasma in a second reactant comprising hydrogen that may also comprise nitrogen and that does not comprise oxygen; and exposing the substrate to a purge gas and/or vacuum;

optionally repeating the contacting and exposing steps until a silicon-containing thin film of a desired thickness and composition is obtained.

In some embodiments, the PEALD process is performed at a temperature between about 100° C. to about 700° C., about 200° C. to about 500° C., about 250° C. to about 450° C., about 300° C. to about 450° C., or at about 350° C. to about 450° C. In some embodiments the temperature is about 400° C.

In some embodiments a plasma may be generated by applying RF power to the second reactant. The RF power may be applied to second reactant to thereby generate reactive species. In some embodiments the RF power may be applied to the second reactant that flows continuously through the reaction chamber, and/or that flows through a remote plasma generator. Thus in some embodiments the plasma is generated in situ, while in other embodiments the plasma is generated remotely. In some embodiments the RF power applied to the second reactant is from about 10 W to about 2000 W, from about 100 W to about 1000 W or from about 200 W to about 800 W. In some embodiments the RF power applied to the second reactant is about 200 W. In some embodiments the RF power applied to the second reactant is about 400 W. In some embodiments the RF power applied to the second reactant is about 800 W.

As discussed in more detail below, in some embodiments for depositing a silicon-containing film, one or more PEALD deposition cycles begin with provision of a silicon precursor, followed by a carbon precursor and/or the second reactant. In other embodiments deposition may begin with provision of the second reactant, such as the carbon precursor, followed by a silicon precursor and the second reactant. One of skill in the art will recognize that the first precursor phase generally reacts with the termination left by the last phase in the previous cycle. Thus, while no reactant may be previously adsorbed on the substrate surface or present in the reaction space if the reactive species phase is the first phase in the first PEALD cycle, in subsequent PEALD cycles the reactive species phase will effectively follow the silicon phase. In some embodiments one or more different PEALD sub-cycles are provided in the process for forming a silicon-containing thin film.

Silicon Precursors

A number of different suitable silicon precursors can be used in the PEALD processes.

In some embodiments a suitable silicon precursor may comprise two silicon atoms connected by, or bonded to, an oxygen atom. In some embodiments a suitable silicon precursor may comprise a siloxane. In some embodiments a suitable silicon precursor may comprise two silicon atoms connected by, or bonded to, a nitrogen atom. In some embodiments a suitable silicon precursor may comprise a silazane.

In some embodiments a suitable silicon precursor may comprise two silicon atoms connected by, or bonded to, at least one hydrocarbon group. In some embodiments a suitable silicon precursor may comprise two silicon atoms connected by, or bonded to, at least one alkyl group. In some embodiments a silicon atom may be connected or bonded to the hydrocarbon group by an oxygen atom or an amine group. In some embodiments a suitable silicon precursor may comprise a silyl ether. In some embodiments a suitable silicon precursor may comprise a silyl ester.

In some embodiments a suitable silicon precursor may comprise two silicon atoms connected by or bonded to a malonate group. In some embodiments a silicon atom may be connected or bonded to the malonate group by an oxygen atom or an amine group. In some embodiments a suitable silicon precursor may comprise a malonate compound. In some embodiments a suitable silicon precursor may comprise a malonic acid compound. In some embodiments a suitable silicon precursor may comprise dichloro-tetraisoprpyldisiloxane ($TIPDSiCl_2$). In some embodiments a suitable silicon precursor may comprise bis(trimethylsilyl) malonate. In some embodiments a suitable silicon precursor may comprise bis(dimethyldichlorosilyl) malonate.

In some embodiments a silicon precursor suitable for deposition of a silicon-containing film by PEALD processes may comprise a compound having the following general formula (I):

(I)

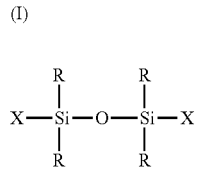

Wherein each R can be independently selected from one of: H, $C_xH_y$, $(C_xH_y)N_z$, $N(C_xH_y)_2$, or $N(C_xH_y)H$ wherein x, y, and z are integers, and each X can be independently selected from one of Cl, I, Br, $NH_2$, H, $CH_2$—Cl, $CH_2$—I, or $CH_2$—Br.

In some embodiments a silicon precursor suitable for deposition of a silicon-containing film by PEALD processes may comprise a compound having the following general formula (II):

(II)

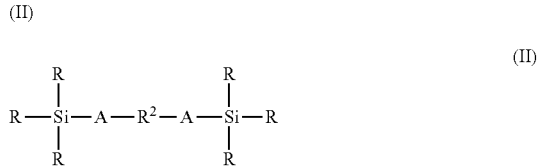

Wherein each R can be independently selected from one of: H, $C_xH_y$, $(C_xH_y)N_z$, $N(C_xH_y)_2$, or $N(C_xH_y)H$ wherein x, y, and z are integers, each A can be independently selected form one of O or NH, and $R^2$ can be (C=O)—$C_aH_b$—(C=O) or $C_aH_b$, wherein a and b are integers.

In some embodiments a silicon precursor suitable for deposition of a silicon-containing film by PEALD processes may comprise a compound having the following general formula (III):

(III)

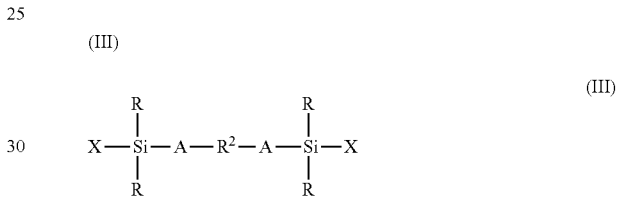

Wherein each R can be independently selected from one of: H, $C_xH_y$, $(C_xH_y)N_z$, $N(C_xH_y)_2$, or $N(C_xH_y)H$, wherein x, y, and z are integers, each X can be independently selected from one of Cl, I, Br, $NH_2$, H, $CH_2$—Cl, $CH_2$—I, or $CH_2$—Br, each A can be independently selected form one of O or NH, and $R^2$ can be (C=O)—$C_aH_b$—(C=O) or $C_aH_b$ wherein a and b are integers.

In some embodiments a first silicon precursor suitable for deposition of a silicon-containing film by PEALD processes may comprise a compound having the following general formula (IV):

(IV)

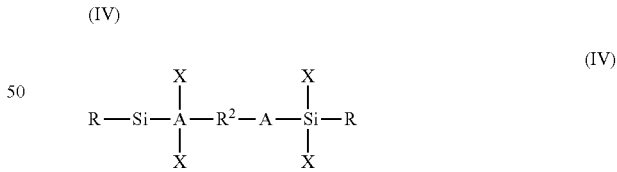

Wherein each R can be independently selected from one of: H, $C_xH_y$, $(C_xH_y)N_z$, $N(C_xH_y)_2$, or $N(C_xH_y)H$ wherein x, y, and z are integers, each X can be independently selected from one of: Cl, I, Br, $NH_2$, H, $CH_2$—Cl, $CH_2$—I, or $CH_2$—Br, each A can be independently selected form one of: O or NH, and $R^2$ can be (C=O)—$C_aH_b$—(C=O) or $C_aH_b$ wherein a and b are integers.

In some embodiments the silicon precursor does not comprise a halogen. In some embodiments the silicon precursor does not comprise nitrogen. According to some embodiments suitable first silicon precursors can include at least compounds having any of the general formulas (I) through (IV).

In some embodiments more than one silicon precursor may contact the substrate surface at the same time during an ALD phase. In some embodiments a silicon precursor may comprise more than one of the silicon precursors described herein. In some embodiments a first silicon precursor is used in a first ALD cycle and a second, different ALD precursor is used in a later ALD cycle. In some embodiments multiple silicon precursors may be used during a single ALD phase, for example in order to optimize certain properties of the deposited silicon-containing film. In some embodiments only one silicon precursor may contact the substrate during the deposition. In some embodiments there may only be one silicon precursor and one second reactant or composition of second reactants in the deposition process. In some embodiments there is no metal precursor in the deposition process. In some embodiments the silicon precursor is not used as a silylating agent.

In some embodiments the deposition temperature and/or the duration of the silicon precursor contacting step are selected such that the silicon precursor does not decompose. In some embodiments the silicon precursor may decompose during the silicon precursor contacting step.

In some embodiments the silicon precursor does not comprise a halogen, such as chlorine or fluorine.

Carbon Precursors

In some embodiments a carbon precursor may also be used in one or more of the presently disclosed PEALD processes, as described herein. In some embodiments a suitable carbon precursor may comprise a hydrocarbon compound. In some embodiments a suitable carbon precursor may comprise an amine. In some embodiments a suitable carbon precursor may comprise an alkene amine compound. In some embodiments a suitable carbon precursor may comprise, for example, ethylene diamine. In some embodiments a suitable carbon precursor may comprise an alkylamine.

In some embodiments a carbon precursor suitable for deposition of a silicon-containing film by PEALD processes may comprise a compound having the following general formula (V):

Wherein each X can be independently selected from one of: $N_xH_y$ or $N_xC_yH_z$ wherein x, y, and z are integers.

In some embodiments a carbon precursor suitable for deposition of a silicon-containing film by PEALD processes may comprise a compound having the following general formula (VI):

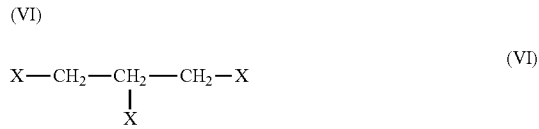

Wherein each X can be independently selected from one of: $N_xH_y$ or $N_xC_yH_z$ wherein x, y, and z are integers.

In some embodiments a carbon precursor suitable for deposition of a silicon-containing film by PEALD processes may comprise a compound having the following general formula (VII):

Wherein each X can be independently selected from one of: $N_xH_y$ or $N_xC_yH_z$ wherein x, y, z, and a are integers.

Second Reactants

As discussed above, the second reactant for depositing silicon-containing films according to the present disclosure may comprise a hydrogen precursor, and may comprise a reactive species. In some embodiments a reactive species includes, but is not limited to, radicals, plasmas, and/or excited atoms or species. Such reactive species may be generated by, for example, plasma discharge, hot-wire, or other suitable methods. In some embodiments the reactive species may be generated remotely from the reaction chamber, for example up-stream from the reaction chamber ("remote plasma"). In some embodiments the reactive species may be generated in the reaction chamber, in the direct vicinity of the substrate, or directly above the substrate ("direct plasma").

Suitable plasma compositions of a PEALD process include hydrogen reactive species, that is, plasma, radicals of hydrogen, or atomic hydrogen in one form or another. In some embodiments a second reactant may comprise a reactive species formed at least in part from $H_2$. In some embodiments, a plasma may also contain noble gases, such as He, Ne, Ar, Kr and Xe, or Ar or He, in plasma form, as radicals, or in atomic form.

In some embodiments the second reactant may comprise reactive species formed from $H_2$. In some embodiments the second reactant may be generated from a gas containing more than about 25 atomic % (at %) hydrogen, more than about 50 at % hydrogen, more than about 75 at % hydrogen, more than about 85 at % hydrogen, more than about 90 at % hydrogen, more than about 95 at % hydrogen, more than about 96 at %, 97 at %, 98 at %, or more than about 99 at % hydrogen.

In some embodiments the gas used to generate reactive species, such as plasma, may consist essentially of hydrogen. Thus, in some embodiments the second reactant may consist essentially of hydrogen plasma, radicals of hydrogen, or atomic hydrogen. In some embodiments the second reactant may comprise more than about 25 at % hydrogen, more than about 50 at % hydrogen, 75 at %, more than about 85 at %, more than about 90 at %, more than about 95 at %, more than about 96 at %, 97 at %, 98 at %, or more than about 99 at % hydrogen plasma, radicals of hydrogen, or atomic hydrogen. In some embodiments the second reactant may be formed, at least in part, from $H_2$ and one or more other gases, where the $H_2$ and other gas or gases are provided at a flow ratio ($H_2$/other gas or gases), from about 1:3 to about 100:1 or greater. In some embodiments the flow ratio ($H_2$/other gas or gases) may be greater than about 1:3, greater than about 1:1, greater than about 3:1, greater than about 5:1, greater than about 10:1, greater than about 20:1, 25:1, 30:1, 50:1, or 100:1.

In some embodiments, the second reactant does not comprise any species generated from oxygen. Thus, in some embodiments reactive species are not generated from a gas containing oxygen. In some embodiments a second reactant comprising reactive species is generated from a gas that does not contain oxygen. For example in some embodiments a second reactant may comprise a plasma generated from a gas that does not contain oxygen. In some other embodiments the second reactant may be generated from a gas containing less than about 50 atomic % (at %) oxygen, less than about 30 at % oxygen, less than about 10 at % oxygen, less than about 5 at % oxygen, less than about 1 at % oxygen, less than about 0.1 at % oxygen, less than about 0.01 at % oxygen, or less than about 0.001 at % oxygen. In some embodiments a second reactant does not comprise $O_2$, $H_2O$ or $O_3$.

In some embodiments, a hydrogen plasma may be free or substantially free of oxygen-containing species (e.g., oxygen ions, radicals, atomic oxygen). For example, oxygen-containing gas is not used to generate the hydrogen plasma. In some embodiments, oxygen-containing gas (e.g., $O_2$ gas) is not flowed into the reaction chamber during the hydrogen plasma step.

In some embodiments oxygen-containing gas is not used to generate the hydrogen plasma. In some embodiments, oxygen-containing gas (e.g., $O_2$ gas) is not flowed into the reaction chamber during the hydrogen plasma step.

In some embodiments, the second reactant does not comprise any species generated from nitrogen. Thus, in some embodiments reactive species are not generated from a gas containing nitrogen. In some embodiments a second reactant comprising reactive species is generated from a gas that does not contain nitrogen. For example in some embodiments a second reactant may comprise a plasma generated from a gas that does not contain nitrogen. In some embodiments the second reactant may be generated from a gas containing less than about 25 atomic % (at %) nitrogen, less than about 20 at % nitrogen, less than about 15 at % nitrogen, less than about 10 at % nitrogen, less than about 5 at % nitrogen, less than about 1 at % nitrogen, less than about 0.1 at % nitrogen, less than about 0.01 at % nitrogen, or less than about 0.001 at % nitrogen. In some embodiments a second reactant does not comprise $N_2$, $NH_3$ or $N_2H_4$.

In some embodiments, a hydrogen plasma may be free or substantially free of nitrogen-containing species (e.g., nitrogen ions, radicals, atomic nitrogen). For example, nitrogen-containing gas is not used to generate the hydrogen plasma. In some embodiments, nitrogen-containing gas (e.g., $N_2$ gas) is not flowed into the reaction chamber during the hydrogen plasma step.

However, in some other embodiments, nitrogen reactive species in the form of plasma, radicals of nitrogen, or atomic nitrogen in one form or another are also provided. Thus, in some embodiments the second reactant may comprise reactive species formed from compounds having both N and H, such as $NH_3$, $N_2H_4$, compounds having the formula $N_xH_y$, compounds having the formula $N_xH_yC_z$, wherein x, y, and z are integers, a mixture of $N_2/H_2$, or other precursors having an N—H bond. In some embodiments the second reactant may be formed, at least in part, from $N_2$.

In some embodiments, a plasma power used for generating a hydrogen-containing plasma can be about 10 Watts (W) to about 2,000 W, about 50 W to about 1000 W, about 100 W to about 1000 W or about 100 W to about 500 W. In some embodiments, a plasma power used for generating a hydrogen-containing plasma can be about 100 W to about 300 W.

In some embodiments, hydrogen containing plasma may also comprise argon or another noble gas. In some embodiments the gas used to generateF reactive species, such as plasma, may consist essentially of argon or another noble gas.

Silicon-Containing Film Characteristics

Silicon-containing thin films deposited according to some of the embodiments discussed herein may achieve impurity levels or concentrations below about 3 at %, below about 1 at %, below about 0.5 at %, or below about 0.1 at % for any one impurity element. In some embodiments a silicon-containing thin film comprises one or more impurities at a detectable level but below about 3 at %, below about 1 at %, below about 0.5 at %, or below about 0.1 at % for any one impurity element. In some thin films, the total impurity level excluding hydrogen may be below about 5 at %, below about 2 at %, below about 1 at %, or below about 0.2 at %. And in some thin films, hydrogen levels may be below about 30 at %, below about 20 at %, below about 15 at %, or below about 10 at %. As used herein, an impurity may be considered any element other than Si, O, N, and/or C. In some embodiments the thin films do not comprise argon.

According to some embodiments, the silicon-containing thin films may exhibit step coverage and pattern loading effects of greater than about 50%, greater than about 80%, greater than about 90%, or greater than about 95%. In some cases step coverage and pattern loading effects can be greater than about 98% and in some case about 100% (within the accuracy of the measurement tool or method). In some embodiments step coverage and pattern loading effects can be greater than about 100%, greater than about 110%, greater than about 120%, greater than about 130%, or greater than about 140%. These values can be achieved in features with aspect ratios of 2 or greater, in some embodiments in aspect ratios of about 3 or greater, in some embodiments in aspect ratios of about 5 or greater and in some embodiments in aspect ratios of about 8 or greater.

In some embodiments the step coverage may be between about 50% and about 110%, between about between about 80% and about 110%, between about 90% and about 110%, between about 95% and 110%, between about 98% and 110%, or between about 100% and 110%. In some embodiments the step coverage may be between about 50% and about 100%, between about between about 80% and about 100%, between about 90% and about 100%, between about 95% and 100%, or between about 98% and 100%.

In some embodiments the growth rate of the film is from about 0.01 Å/cycle to about 5 Å/cycle, from about 0.05 Å/cycle to about 2 Å/cycle. In some embodiments the growth rate of the film is more than about 0.05 Å/cycle, more than about 0.1 Å/cycle, more than about 0.15 Å/cycle, more than about 0.3 Å/cycle, or more than about 0.4 Å/cycle.

As used herein, "pattern loading effect" is used in accordance with its ordinary meaning in this field. While pattern loading effects may be seen with respect to impurity content, density, electrical properties and etch rate, unless indicated otherwise the term pattern loading effect when used herein refers to the variation in film thickness in an area of the substrate where structures are present. Thus, the pattern loading effect can be given as the film thickness in the sidewall or bottom of a feature inside a three-dimensional structure relative to the film thickness on the sidewall or bottom of the three-dimensional structure/feature facing the open field. As used herein, a 100% pattern loading effect (or a ratio of 1) would represent about a completely uniform film property throughout the substrate regardless of features i.e. in other words there is no pattern loading effect (variance in a particular film property, such as thickness, in features vs. open field).

In some embodiments, silicon-containing films are deposited to a thickness of from about 3 nm to about 50 nm, from about 5 nm to about 30 nm, from about 5 nm to about 20 nm. These thicknesses can be achieved in feature sizes (width) below about 100 nm, about 50 nm, below about 30 nm, below about 20 nm, and in some cases below about 15 nm. According to some embodiments, a silicon-containing film is deposited on a three-dimensional structure and the thickness at a sidewall may be slightly even more than 10 nm. In some embodiments silicon-containing films of greater than 50 nm can be deposited. In some embodiments silicon-containing films of greater than 100 nm can be deposited. In some embodiments, SiOC films are deposited to a thickness of more than about 1 nm, more than about 2 nm, more than about 3 nm, more than about 5 nm, more than about 10 nm.

In some embodiments the blanket wet etch rate (WER) in 1 wt % dilute hydrofluoric acid solution (dHF) (nm/min) of a silicon-containing film deposited according to an embodiment herein, relative to the WER of thermal oxide (WERR), may be less than about 3, less than about 2, less than about 1, and less than about 0.5. In some embodiments the blanket WER in 1 wt % dHF relative to the WER of thermal $SiO_2$ (TOX) may be less than about 0.1.

In some embodiments, the amount of etching of silicon-containing films according to the present disclosure may be about 1, 2, 5, 10 or more times less than an amount of etching observed for thermal $SiO_2$ (TOX) in a 1 wt % dHF-dip process (for example in a process in which about 2 to about 3 nm TOX is removed, 1, 2, 5, 10 or more times less silicon-containing is removed when deposited according to the methods disclosed herein).

All atomic percentage (i.e., at %) values provided herein exclude hydrogen for simplicity and because hydrogen is difficult to accurately analyze quantitatively, unless otherwise indicated. However, in some embodiments, if it is possible to analyze the hydrogen with reasonable accuracy, the hydrogen content of the films is less than about 20 at %, less than about 10 at % or less than about 5 at %. In some embodiments the deposited silicon-containing thin film may contain up to about 70% oxygen on an atomic basis (at %). In some embodiments a silicon-containing film may comprise oxygen from about 10% to about 70%, from about 15% to about 50%, or from about 20% to about 40% on an atomic basis. In some embodiments a silicon-containing film may comprise at least about 20%, about 40% or about 50% oxygen on an atomic basis.

In some embodiments the deposited silicon-containing thin film may contain up to about 40% carbon on an atomic basis (at %). In some embodiments a silicon-containing film may comprise carbon from about 0.1% to about 40%, from about 0.5% to about 40%, from about 1% to about 30%, or from about 5% to about 20% on an atomic basis. In some embodiments a SiOC film may comprise at least about 1%, about 10% or about 20% carbon on an atomic basis.

In some embodiments the deposited silicon-containing thin film may contain up to about 50% silicon on an atomic basis (at %). In some embodiments a silicon-containing film may comprise silicon from about 10% to about 50%, from about 15% to about 40%, or from about 20% to about 35% on an atomic basis. In some embodiments a silicon-containing film may comprise at least about 15%, about 20%, about 25% or about 30% silicon on an atomic basis.

In some embodiments, the deposited silicon-containing films do not comprise an appreciable amount of nitrogen. However, in some embodiments a silicon-containing film comprising nitrogen is deposited. In some embodiments, the deposited silicon-containing films comprises less than about 30 at %, less than about 20 at %, less than about 15 at %, less than about 10 at %, less than about 5 at % of nitrogen, less than about 1 at % nitrogen, or less than about 0.1 at % nitrogen. In some embodiments the silicon-containing thin films do not comprise nitrogen.

As discussed above, in some embodiments a silicon-containing film may comprise Si—C bonds and/or Si—O bonds. In some embodiments a silicon-containing film may additionally comprise Si—N bonds. In some embodiments a silicon-containing film may comprise Si—C bonds and Si—O bonds and may not comprise Si—N bonds. In some embodiments the silicon-containing films may comprise more Si—O bonds than Si—C bonds, for example a ratio of Si—O bonds to Si—C bonds may be from about 1:1 to about 10:1.

In some embodiments a deposited SiOC film may comprise one or more of SiOC or SiOCN.

In some embodiments a silicon-containing film is not a low-k film, for example a silicon-containing film is not a porous film. In some embodiments a silicon-containing film is a continuous film. In some embodiments a silicon-containing film has a k-value that is less than about 10. In some embodiments a silicon-containing film has a k-value that is less than about 7. In some embodiments a silicon-containing film has a k-values from about 2 to about 10. In some embodiments a silicon-containing film has a k-value that is less than about 5.0, less than about 4.5, less than about 4.3, less than about 4.1. In some embodiments a silicon-containing film has a k-value that from about 3.0 to about 7, from about 3.0 to about 5.5, from about 3.0 to about 5.0, from about 3.5 to about 4.8, from about 3.5 to about 4.7. In some embodiments a silicon-containing film has a k-value that is more than the k-value of any low-k film. In some embodiments a SiOC film has a k-value that is more than pure $SiO_2$.

In some embodiments silicon-containing films deposited according to the present disclosure do not comprise a laminate or nanolaminate structure.

In some embodiments a silicon-containing film deposited according to the present disclosure is not a self-assembled monolayer (SAM). In some embodiments a silicon-containing film deposited according to the present disclosure does not consist of separate, individual molecules which are not bonded to each other. In some embodiments a silicon-containing film deposited according to the present disclosure comprises a material which is substantially bonded or linked together. In some embodiments a silicon-containing film deposited according to the present disclosure is not a functional layer, is not amino-functionalized, and/or is not used as a functional surface. In some embodiments a silicon-containing film deposited according to the present disclosure is not terminated with —$NH_2$ groups. In some embodiments a silicon-containing film deposited according to the present disclosure does not contain a substantial amount of —$NH_2$ groups.

Examples

Exemplary SiOC thin films were deposited by a PEALD process as described herein. Bis(trimethylsilyl) malonate was used as the silicon precursor for the first sample film, and bis(dimethyldichlorosilyl) malonate was used as a silicon precursor for the second film. The second reactant was a plasma generated from $NH_3$. For both samples, the deposition temperature was 400° C., the reaction chamber pressure was 400 Pa, and the second reactant was generated by applying 200 W of RF power to the second reactant gas. In a first sample film, a deposition cycle that did not include a carbon precursor was utilized. The deposition cycle for the first sample included:

contacting a substrate with a vapor phase silicon precursor comprising bis(trimethylsilyl) malonate such that a silicon compound adsorbs on the substrate surface;

exposing the substrate to a purge gas comprising argon;

contacting the substrate with reactive species generated by forming a plasma in a second reactant comprising $NH_3$ and not comprising oxygen; and exposing the substrate to a purge gas comprising argon;

repeating the deposition cycling steps until a SiOC thin film of a desired thickness and composition is obtained.

A second sample film was also deposited, using a deposition cycle that included:

contacting a substrate with a vapor phase silicon precursor comprising bis(dimethyldichlorosilyl) malonate such that a silicon compound adsorbs on the substrate surface;

exposing the substrate to a purge gas comprising argon;

contacting the substrate with reactive species generated by forming a plasma in a second reactant comprising $NH_3$ and not comprising oxygen; and exposing the substrate to a purge gas comprising argon;

repeating the deposition cycling steps until a SiOC thin film of a desired thickness and composition is obtained.

Table 1 shows the characteristics of these sample films.

| Sample | Film Composition | Growth per Cycle (nm/cycle) | Step Coverage (%) | Pattern Loading Effect (%) | 1 wt % dHF WER R to TOX | Carbon Concentration (at %) | Nitrogen Concentration (at %) |
|---|---|---|---|---|---|---|---|
| 1 | SiOC | 0.02 | 80 | 85 | 0.2 | 8 | 10 |
| 2 | SiOC | 0.04 | 94 | 97 | <0.1 | 16 | <5 (below detection threshold) |

Exemplary SiOCN thin films were deposited by a PEALD process as described herein. First and second sample films were deposited using $TIPDSiCl_2$ as a silicon precursor. The second reactant was a plasma generated from $NH_3$.

A third sample film was depositing using bis(dimethyldichlorosilyl) malonate as the silicon precursor. The second reactant was a plasma generated from $NH_3$.

For all samples the deposition temperatures w 400° C., the reaction chamber pressure was 400 Pa, and the second reactant was generated by applying 200 W of RF power to the second reactant gas.

For the first sample film, a deposition cycle that included a carbon precursor phase after the silicon precursor phase and before the substrate was contacted with the second reactant. Ethylene diamine was used as the carbon precursor. The deposition cycle for the first sample included:

contacting a substrate with a vapor phase silicon precursor comprising $TIPDSiCl_2$ such that a silicon compound adsorbs on the substrate surface;

exposing the substrate to a purge gas comprising argon;

For the second sample film, the deposition cycle did not include a carbon precursor phase. The deposition cycle for the second sample included:

contacting a substrate with a vapor phase silicon precursor comprising $TIPDSiCl_2$ such that a silicon compound adsorbs on the substrate surface;

exposing the substrate to a purge gas comprising argon;

contacting the substrate with reactive species generated by forming a plasma in a second reactant comprising $NH_3$ and not comprising oxygen; and exposing the substrate to a purge gas comprising argon;

repeating the deposition cycling steps until a SiOCN thin film of a desired thickness and composition is obtained.

For the third sample film, a deposition cycle that included a carbon precursor phase after the silicon precursor phase and before the second reactant phase was used. Ethylene diamine was used as the carbon precursor. The deposition cycle for the third sample included:

contacting a substrate with a vapor phase silicon precursor comprising bis(dimethyldichlorosilyl) malonate such that a silicon compound adsorbs on the substrate surface;

exposing the substrate to a purge gas comprising argon;

contacting a substrate with a vapor phase carbon precursor comprising ethylene diamine;

exposing the substrate to a purge gas comprising argon;

contacting the substrate with reactive species generated by forming a plasma in a second reactant comprising $NH_3$ and not comprising oxygen; and exposing the substrate to a purge gas comprising argon;

repeating the deposition cycle until a SiOCN thin film of a desired thickness and composition is obtained.

Table 2 shows the characteristics of these sample films.

| Sample | Film Composition | Growth per Cycle (nm/cycle) | Step Coverage (%) | Pattern Loading Effect (%) | 1 wt % dHF WER R to TOX | Carbon Concentration (at %) | Nitrogen Concentration (at %) |
|---|---|---|---|---|---|---|---|
| 1 | SiOCN | 0.04 | 90 | 90 | 0.1 | 10 | 7 |
| 2 | SiOCN | 0.03 | 95 | 95 | <0.1 | 15 | 8 |
| 3 | SiOCN | 0.05 | 93 | 96 | <0.1 | 16 | <5 (below detection threshold) | contacting a substrate with a vapor phase carbon precursor comprising ethylene diamine;

exposing the substrate to a purge gas comprising argon;

contacting the substrate with reactive species generated by forming a plasma in a second reactant comprising $NH_3$ and not comprising oxygen; and exposing the substrate to a purge gas comprising argon;

repeating the deposition cycle until a SiOCN thin film of a desired thickness and composition is obtained.

As used herein, the term "about" may refer to a value that is within 15%, within 10%, within 5%, or within 1% of a given value.

The terms "film" and "thin film" are used herein for simplicity. "Film" and "thin film" are meant to mean any continuous or non-continuous structures and material deposited by the methods disclosed herein. For example, "film" and "thin film" could include 2D materials, nanorods, nanotubes or nanoparticles or even single partial or full molecular layers or partial or full atomic layers or clusters of atoms and/or molecules. "Film" and "thin film" may comprise material or layer with pinholes, but still be at least partially continuous.

It will be understood by those of skill in the art that numerous and various modifications can be made without departing from the spirit of the present invention. The described features, structures, characteristics and precursors can be combined in any suitable manner. Therefore, it should be clearly understood that the forms of the present invention are illustrative only and are not intended to limit the scope of the present invention. All modifications and changes are intended to fall within the scope of the invention, as defined by the appended claims.

What is claimed is:

1. A method of forming a silicon-containing thin film on a substrate in a reaction space by a plasma enhanced atomic layer deposition (PEALD) process, wherein the PEALD process comprises two or more deposition cycles comprising:
   contacting a surface of the substrate with a vapor phase silicon precursor comprising a siloxane;
   contacting the substrate with at least one reactive species generated by plasma formed from a second reactant comprising hydrogen, wherein the second reactant does not comprise oxygen.

2. The method of claim 1, wherein the silicon-containing film comprises silicon oxycarbide (SiOC).

3. The method of claim 1, wherein the silicon-containing film comprises silicon oxycarbonitride (SiOCN).

4. The method of claim 1, wherein the silicon precursor comprises dichloro-tetraisoprpyldisiloxane (TIPDSiCl$_2$).

5. The method of claim 1, wherein the silicon precursor comprises a malonate compound.

6. The method of claim 1, wherein the second reactant comprises H$_2$.

7. The method of claim 6, wherein the second reactant further comprises N$_2$.

8. The method of claim 1, wherein the second reactant comprises NH$_3$.

9. The method of claim 1, wherein the second reactant comprises a noble gas.

10. The method of claim 1, wherein the silicon-containing film is deposited on a three-dimensional structure on the substrate.

11. The method of claim 5, wherein the silicon precursor comprises bis(dimethyldichlorosilyl) malonate.

12. The method of claim 5, wherein the silicon precursor comprises bis(trimethylsilyl) malonate.

13. The method of claim 1, further comprising contacting the substrate with a vapor phase carbon precursor in the deposition cycle.

14. The method of claim 13, wherein the substrate is contacted with the vapor phase carbon precursor before the substrate is contacted with at least one reactive species generated by plasma formed from a second reactant.

15. The method of claim 13, wherein the substrate is contacted with the vapor phase carbon precursor after the substrate is contacted with at least one reactive species generated by plasma formed from a second reactant.

16. The method of claim 15, further comprising contacting the substrate with at least one reactive species generated by plasma formed from a second reactant comprising hydrogen after contacting the substrate with the carbon precursor, wherein the second reactant does not comprise oxygen.

17. A method for depositing a silicon-containing thin film on a substrate in a reaction space comprising repeating a deposition cycle two or more times, wherein the deposition cycle comprise:
   contacting a surface of the substrate with a vapor phase silicon precursor comprising two silicon atoms connected by an oxygen atom;
   removing excess silicon precursor and reaction byproducts, if any;
   contacting the surface of the substrate with a vapor phase carbon precursor;
   removing excess carbon precursor and reaction byproducts, if any;
   contacting a surface of the substrate with a second reactant comprising reactive hydrogen species; and
   removing excess second reactant and reaction byproducts, if any.

18. The method of claim 17, wherein the silicon precursor comprises TiPDSiCl$_2$.

19. The method of claim 17, wherein the silicon precursor comprises bis(trimethylsilyl) malonate or bis(dimethyldichlorosilyl) malonate.

20. The method of claim 17, wherein the carbon precursor comprises an amine.

21. The method of claim 20, wherein the carbon precursor comprises ethylene diamine.

* * * * *

UNITED STATES PATENT AND TRADEMARK OFFICE
CERTIFICATE OF CORRECTION

| | |
|---|---|
| PATENT NO. | : 10,186,420 B2 |
| APPLICATION NO. | : 15/787342 |
| DATED | : January 22, 2019 |
| INVENTOR(S) | : Atsuki Fukazawa |

Page 1 of 1

It is certified that error appears in the above-identified patent and that said Letters Patent is hereby corrected as shown below:

In the Specification

Column 1, Line 47, change "dichloro-tetraisoprpyldisiloxane" to --dichloro-tetraisopropyldisiloxane--.

Column 3, Line 3, change "TIn" to --In--.

Column 7, Line 21, change "different,carbon" to --different, carbon--.

Column 15, Line 44-45 (approx.), change "dichloro-tetraisoprpyldisiloxane" to --dichloro-tetraisopropyldisiloxane--.

Column 19, Line 54, change "generateF" to --generate--.

In the Claims

Column 25, Line 31, in Claim 4, change "dichloro-tetraisoprpyldisiloxane" to --dichloro-tetraisopropyldisiloxane--.

Signed and Sealed this
Thirtieth Day of April, 2019

Andrei Iancu
*Director of the United States Patent and Trademark Office*